(12) United States Patent
Pitcher

(10) Patent No.: US 9,275,833 B2
(45) Date of Patent: Mar. 1, 2016

(54) METHODS OF FORMING LAYERS

(71) Applicant: SEAGATE TECHNOLOGY LLC, Cupertino, CA (US)

(72) Inventor: Philip George Pitcher, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/756,669

(22) Filed: Feb. 1, 2013

(65) Prior Publication Data

US 2013/0200280 A1 Aug. 8, 2013

Related U.S. Application Data

(60) Provisional application No. 61/594,547, filed on Feb. 3, 2012.

(51) Int. Cl.
*H01J 37/317* (2006.01)
*H01L 21/02* (2006.01)
*C23C 14/48* (2006.01)

(52) U.S. Cl.
CPC .............. *H01J 37/3174* (2013.01); *C23C 14/48* (2013.01); *H01J 37/3171* (2013.01); *H01L 21/02115* (2013.01)

(58) Field of Classification Search
CPC . H01J 37/317; H01J 37/3174; H01J 37/3178; H01J 37/3171; C23C 14/221; C23C 14/223; H01L 21/02115
USPC ................................. 250/492.2, 492.21, 492.3
See application file for complete search history.

(56) References Cited

U.S. PATENT DOCUMENTS

| | | | | |
|---|---|---|---|---|
| 5,327,475 A | * | 7/1994 | Golovanivsky | G03F 7/70008 378/143 |
| 5,374,318 A | | 12/1994 | Rabalais | |
| 5,379,712 A | | 1/1995 | Armini | |
| 5,625,195 A | * | 4/1997 | Grouillet | H01J 27/18 250/423 R |
| 5,719,403 A | * | 2/1998 | Purser | H01J 37/3171 250/251 |

(Continued)

FOREIGN PATENT DOCUMENTS

| | | |
|---|---|---|
| EP | 0240088 | 10/1987 |
| EP | 499357 B1 | 8/1992 |

(Continued)

OTHER PUBLICATIONS

Ito, K., et al, "Evaluation of thin films fabricated by low energy direct ion beam deposition for soft x-rays" Nuclear Instruments and Methods in Physics Research B59/60 (1991) 321-325.*

(Continued)

*Primary Examiner* — Wyatt Stoffa
(74) *Attorney, Agent, or Firm* — Mueting, Raasch & Gebhardt, P.A.

(57) ABSTRACT

A method of forming a layer, the method including providing a substrate having at least one surface adapted for deposition thereon; and directing a particle beam towards the surface of the substrate, the particle beam including moderately charged ions (MCIs), substantially all the MCIs independently have charges from ±2 to ±6 and kinetic energies of not greater than about 200 eV, wherein the MCIs do not penetrate more than about 30 Å into the surface of the substrate to form a layer on the substrate.

20 Claims, 3 Drawing Sheets

(56) References Cited

U.S. PATENT DOCUMENTS

| | | | |
|---|---|---|---|
| 5,785,825 A * | 7/1998 | Hwang | G11B 5/72 204/192.15 |
| 5,849,093 A * | 12/1998 | Andra | B01J 19/081 134/1 |
| 6,130,436 A | 10/2000 | Renau | |
| 6,303,214 B1 * | 10/2001 | Chour | G11B 5/72 428/212 |
| 6,312,798 B1 * | 11/2001 | Ma | G11B 5/72 428/336 |
| 6,589,676 B1 | 7/2003 | Gui | |
| 6,632,483 B1 | 10/2003 | Callegari | |
| 6,641,932 B1 | 11/2003 | Xu | |
| 6,839,191 B2 | 1/2005 | Sugiura | |
| 6,861,642 B2 | 3/2005 | Ichiki | |
| 7,018,729 B2 * | 3/2006 | Pocker | C23C 14/0605 428/835 |
| 7,377,228 B2 | 5/2008 | Mack | |
| 7,476,855 B2 | 1/2009 | Huang | |
| 8,077,559 B1 | 12/2011 | Miyauchi | |
| 8,325,567 B2 | 12/2012 | Miyauchi | |
| 8,351,151 B2 | 1/2013 | Katine | |
| 8,351,307 B1 | 1/2013 | Wolf | |
| 8,455,060 B2 | 6/2013 | Tabat | |
| 8,461,763 B2 * | 6/2013 | Won | H01J 27/18 118/723 MA |
| 2003/0054133 A1 | 3/2003 | Wadley | |
| 2004/0146685 A1 | 7/2004 | Ma | |
| 2005/0012052 A1 * | 1/2005 | Platzgummer | B82Y 10/00 250/492.21 |
| 2006/0049348 A1 | 3/2006 | Petrov | |
| 2006/0208202 A1 | 9/2006 | Gupta | |
| 2006/0238133 A1 | 10/2006 | Horsky | |
| 2008/0067442 A1 | 3/2008 | Vanderberg | |
| 2008/0230724 A1 * | 9/2008 | Low | H01J 37/05 250/492.21 |
| 2008/0305598 A1 | 12/2008 | Horsky | |
| 2009/0189096 A1 | 7/2009 | Chen | |
| 2009/0237838 A1 * | 9/2009 | Fukushima | G11B 5/855 360/110 |
| 2010/0061199 A1 | 3/2010 | Hirara | |
| 2010/0123965 A1 | 5/2010 | Lee | |
| 2010/0123967 A1 | 5/2010 | Batra | |
| 2010/0190036 A1 | 7/2010 | Komvopoulos | |
| 2010/0209627 A1 * | 8/2010 | Tabat | C23C 16/513 427/595 |
| 2011/0026161 A1 | 2/2011 | Ikeda | |
| 2011/0205863 A1 | 8/2011 | Zhao | |
| 2011/0294398 A1 | 12/2011 | Hu | |
| 2011/0317528 A1 | 12/2011 | Miyauchi | |
| 2012/0045662 A1 | 2/2012 | Zou | |
| 2013/0200280 A1 | 8/2013 | Pitcher | |
| 2013/0202809 A1 * | 8/2013 | Pitcher | C23C 14/48 427/523 |
| 2014/0272179 A1 | 9/2014 | Radovanov | |
| 2015/0064365 A1 | 3/2015 | Pitcher | |

FOREIGN PATENT DOCUMENTS

| | | |
|---|---|---|
| EP | 0942072 | 9/1999 |
| EP | 1328027 | 7/2003 |
| JP | 2008-077756 | 4/2008 |
| WO | WO 94/21557 | 9/1994 |
| WO | WO 97/45834 | 12/1997 |

OTHER PUBLICATIONS

U.S. Appl. No. 13/440,068, Apr. 5, 2012, Pitcher.
U.S. Appl. No. 13/440,071, Apr. 5, 2012, Pitcher.
U.S. Appl. No. 13/440,073, Apr. 5, 2012, Pitcher.
Al-Bayati et al., Junction Profiles of Sub keV Ion Implantation for Deep Sub-Quarter Micron Devices, *IEEE*, 2000, pp. 87-90.
Angel et al., "Enhanced Low Energy Drift-Mode Beam Currents in a High Current Ion Implanter," *IEEE*, 1999, pp. 219-222.
Robertson, J., "Diamond-Like Amorphous Carbon," *Materials Science and Engineering R* 37, 2002, pp. 129-281.
U.S. Appl. No. 13/798,469, Mar. 13, 2013, Pitcher.
U.S. Appl. No. 13/923,922, Jun. 21, 2013, Pitcher.
U.S. Appl. No. 13/923,925, Jun. 21, 2013, Pitcher.
PCT/US2013/030659 Search Report and Written Opinion dated Jun. 17, 2013.
PCT/US2013/024269 Search Report and Written Opinion dated Jun. 21, 2013.
Piazza et al., "Large Area Deposition of Hydrogenated Amorphous Carbon Films for Optical Storage Disks", Diamond and Related Materials, vol. 13, No. 4-8, Apr. 2004, pp. 1505-1510.
Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.
Liu et al., "Influence of the Incident Angle of Energetic Carbon Ions on the Properties of Tetrahedral Amorphous Carbon (ta-C) Films", Journal of Vacuum Science and Technology, vol. 21, No. 5, Jul. 25, 2003, pp. 1665-1670.
PCT/US2013/024273 Search Report and Written Opinion dated Apr. 2, 2013.
PCT/US2013/024274 Search Report and Written Opinion dated Apr. 2, 2013.
Kazuhiko et al., "Evaluation of Thin Films Fabricated by Low Energy Direct Ion Beam Deposition for Soft X-Rays", *Nuclear Instruments & Methods in Physics Research, Seciton—B:Beam Interactions with Materials and Atoms*, Elsevier, Amsterdam, NL, vol. B59/60, No. Pt. 01; Jul. 1, 1991 pp. 321-325.
Hofsass et al., "Doping and Growth of Diamond-Like Carbon Films by Ion Beam Deposition", *Diamond and Related Materials*, Elsevier Science Publishers, Amsterdam, NL, vol. 3, No. 1/02, Jan. 1, 1994, pp. 137-142.
Yamada Isao et al., "Current Research and Development Topics on Gas Cluster Ion-Beam Processes", *Journal of Vacuum Science and Technology*, Part A., AVS/AIP, Melville, NY, US, vol. 23, No. 4, Jun. 28, 2005, pp. 1090-1099.
Zengliang, "Introduction to Ion Beam Biotechnology," 2008, 6 pages.
Notification Concerning Transmittal of Copy of International Preliminary Examination Report for PCT/US2013/024269 dated Aug. 14, 2014, 6 pages.
Lifshitz et al., "Supplementation Model for Film Growth from Hyper Thermal Species," *Physical Review B*, vol. 41, No. 15, May 15, 1990, pp. 10 468-10 480.
Webster's Nine New Collegiate Dictionary, Merriam-Webster incorporated, publishers; Springfield, Massachusetts, USA, 1990 (no month), excerpt p. 829.

* cited by examiner

METHODS OF FORMING LAYERS

PRIORITY

This application claims priority to U.S. Provisional Application Nos. 61/594,547 entitled "SLOW MULTICHARGED ION SURFACE NANOENGINEERING PROCESS", having docket number STL17144.01 filed on Feb. 3, 2012, the disclosure of which is incorporated herein by reference thereto.

BACKGROUND

Materials engineering of surfaces, interfaces or sub-surface layers, on the scale of sub-monolayer to few nanometer depths, is becoming increasingly more technologically important in many diverse fields. Such fields can include, for example, data storage, microelectronics, catalysis and biomedical applications to name only a few. Novel processes for carrying out such materials engineering will therefore always be necessary.

SUMMARY

Process interactions in surface nanoengineering technology may be confined to surface layer atoms or to depths within a few bond lengths from the surface. Disclosed herein are methods to extend and improve surface nanoengineering technology including for example, surface implantation (SI), surface sub-plantation (SSP), etching, doping and interfacial engineering. The methods disclosed herein utilize slow, low to moderately multi-charged, monoatomic or molecular or cluster, ions. Applications can include for example, surface modification, materials synthesis and compositional modification on a depth scale extending a few nanometers from the surface, etching and interfacial engineering. Carbon or hydrogenated carbon films are discussed herein, but disclosed methods are widely applicable to other materials including for example, graphene as well as other elements or combinations of elements. In some embodiments, layers of elements up to approximately 250 atomic mass units and combinations thereof, can be formed. Furthermore, various types of materials, including for example, metastable surface compositions or surface layers can be formed. References contained herein to carbon films are exemplary only and as such are intended to illustrate but not limit the scope of the present disclosure.

Disclosed herein are methods of forming a layer, the method including providing a substrate having at least one surface adapted for deposition thereon; and directing a particle beam towards the surface of the substrate, the particle beam including moderately charged ions (MCIs), substantially all the MCIs independently have charges from ±2 to ±6 and kinetic energies of not greater than about 200 eV, wherein the MCIs do not penetrate more than about 30 Å into the surface of the substrate to form a layer on the substrate.

Also disclosed herein are methods of forming a layer, the method including providing a substrate having at least one surface adapted for deposition thereon; and directing a particle beam towards the surface of the substrate, the particle beam including moderately charged ions (MCIs), substantially all the MCIs independently have charges from ±2 to ±10 and kinetic energies of not greater than about 2000 eV, wherein the MCIs do not penetrate more than about 50 Å into the surface of the substrate to form a layer on the substrate.

A method of forming a layer, the method including providing a substrate having at least one surface adapted for deposition thereon; and directing a particle beam towards the surface of the substrate, the particle beam including moderately charged ions (MCIs) wherein substantially all the MCIs independently have charges from ±2 to ±10 and kinetic energies have kinetic energies between about 5 eV and 2000 eV, and wherein the particle beam is directed at the surface using at least an accel-decel beam transport technique, wherein the MCIs do not penetrate more than about 30 Å into the surface of the substrate to form a layer on the substrate.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
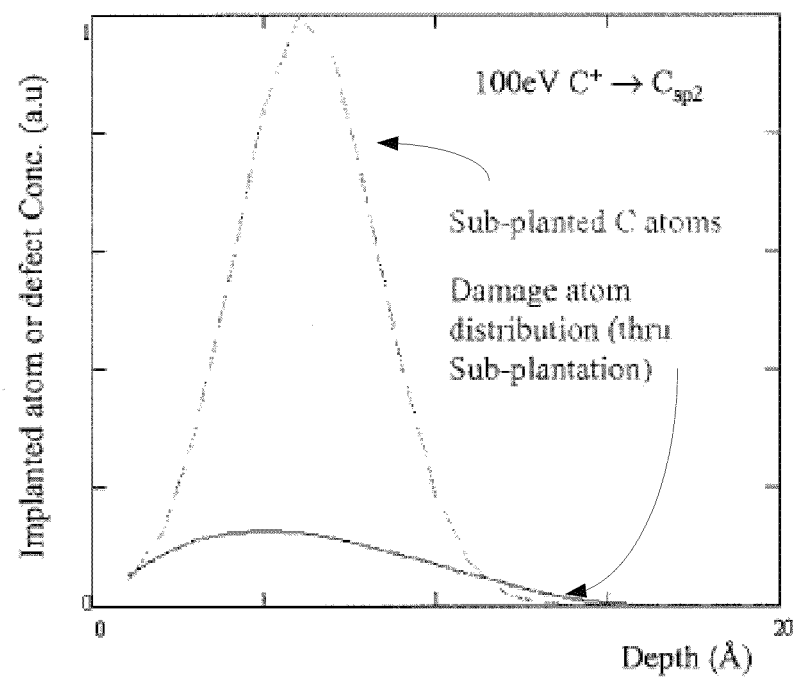
FIG. 1 shows the concentration of both sub-planted carbon atoms and damaged atoms as a function of depth (Å).

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive. It should be noted that "top" and "bottom" (or other terms like "upper" and "lower") are utilized strictly for relative descriptions and do not imply any overall orientation of the article in which the described element is located.

Disclosed methods can provide ways of extending and improve surface nanoengineering technology including, but not limited to, surface implantation (SI), surface sub-plantation (SSP), etching, doping and interfacial engineering. Methods disclosed herein can be utilized for an essentially unlimited number of applications, including, for example, data storage, microelectronics, catalysis and biomedical applications.

In many important thin film applications, such as for example advanced overcoat technology for data storage, a transition from commonly utilized thin film deposition to surface nanoengineering technology may be better able to meet increasing areal density demands. Thickness, uniformity and process reproducibility are commonly utilized critical to quality (CTQ) measures in overcoat engineering. Disclosed methods can provide improvements in the mechanical, chemical, and thermal robustness properties desired in overcoats. Disclosed methods may also be able to provide new forms of carbon based materials and/or metastable materials that are engineered on and/or into surfaces or near surface regions to meet future head media spacing (HMS) and thermo, mechanical, and chemical requirements of overcoats.

In the exemplary context of thin film applications for data storage overcoats, studies on relatively thick carbon films (tens of nanometers to micrometers) show that an increased ratio of sp3 to sp2 carbon atoms (sp3/sp2) generally improves the characteristics of carbon films. Sub-plantation models are well documented in the literature as a hyperthermal processing technique where shallow ion implantation of energetic carbon ions induces localized increases in film density accommodated by an increase in sp3 bond hybridization (sp3/sp2 ratio). These techniques are generally reported for films that are significantly thicker than those desired for head overcoat applications, for example. Application of these well-known approaches can be complicated for nm scale thickness films because of the non-linear interactions of energetic, implanting particles with substrate atoms with respect to depth into a surface.

At typical ion energies of about 100 eV, the depth of the sub-planted atoms and resultant damage range profiles are significant in overcoat applications (because of the thin nature of the overcoat) and can have a large impact on the atomic composition, bonding and structure of layers and interfaces below the surface being actively processed. FIG. 1 shows a theoretical representation of the amount of sub-planted carbon atoms and damaged atoms versus depth (Å) at 100 eV. The length scale is such that when processing carbon overcoat films with the intention of producing a high sp3 content, the actual carbon overcoat film may have a final surface that is undesirably rich in sp2. This may be indicative that the atomic interactions required to create sp3 could have a higher probability to occur several layers below the actively processed surface. Further, a situation may occur in which previously created sp3 regions in the film could be reverted to sp2 by undesirable atomic relaxation processes resulting from defect migration effects or thermal dissipation of ion kinetic energy which can extend significantly beyond the ion interaction depth.

Applicants commonly owned U.S. patent application Ser. No. 13/440,068 entitled "METHODS OF FORMING LAYERS" filed on Apr. 5, 2012; Ser. No. 13/440,071 entitled "METHODS OF FORMING LAYERS" filed on Apr. 5, 2012; and Ser. No. 13/440,073 entitled "METHODS OF FORMING LAYERS" filed on Apr. 5, 2012, the disclosures of which are incorporated herein by reference thereto, disclosed methods of surface nanoengineering using a SSP method to engineer near layer-by-layer growth with controlled film characteristics, in contrast to depth dependent synthesis. In that disclosure, sub-plantation processing effects were confined to the surface layer and/or to the top few surface layers of the continuously grown layer as growth proceeded. This feature both differentiated that process from conventional sub-plantation techniques and eliminated effects through non-linear, atomic interaction effects (see Applicants' other commonly owned U.S. patent application Ser. No. 13/440,068, entitled "METHODS OF FORMING LAYERS" filed on Apr. 5, 2012, the disclosure of which is incorporated herein by reference thereto).

Figure 2:
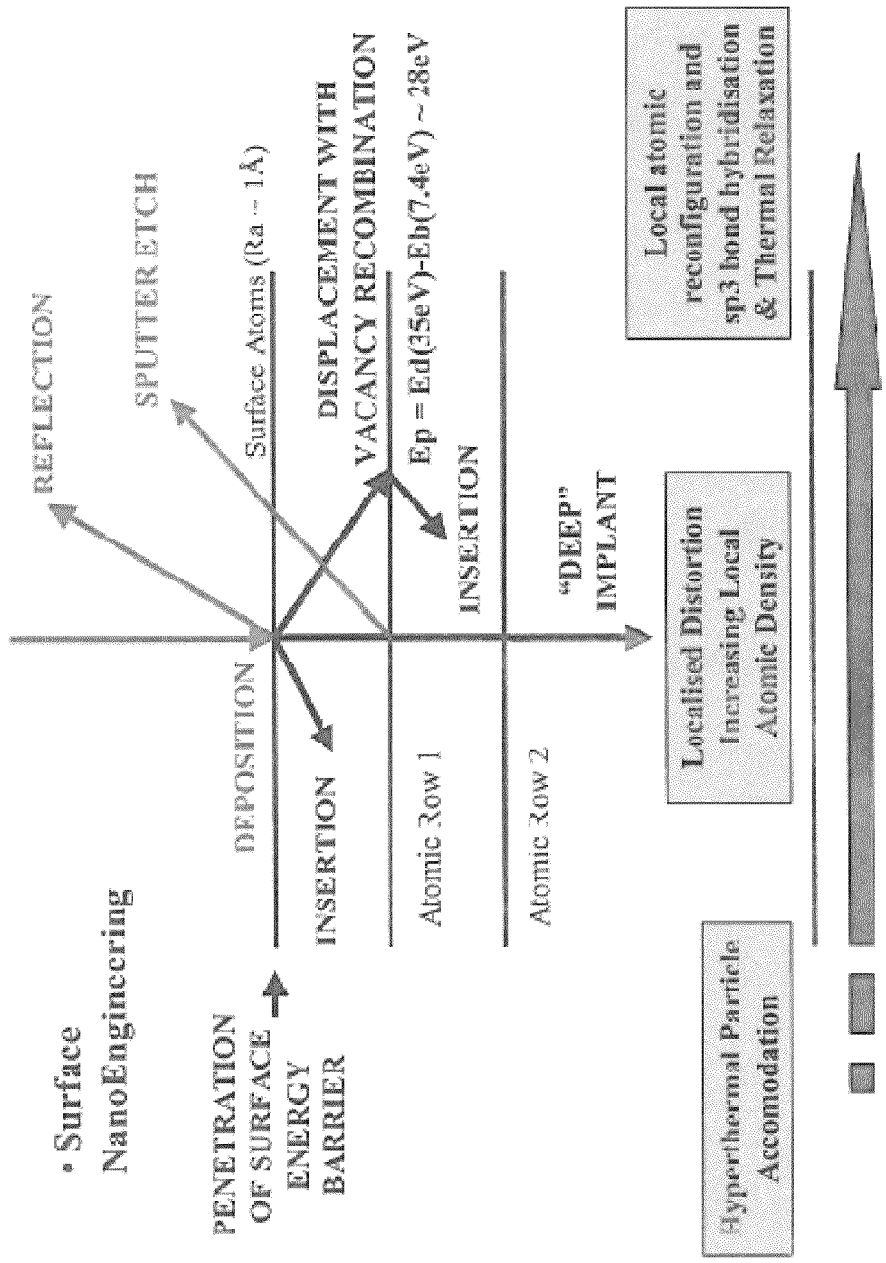
FIG. 2 illustrates how surface implantation can modulate surface density through insertion and displacement effects.

Methods disclosed herein strive to confine the processing effects to the top few bond lengths of the layer continuously, as growth proceeds. This can minimize or eliminate the effects of non-linear atomic interaction of implanting particles with substrate atoms. FIG. 2 illustrates how surface implantation can modulate surface density through insertion and displacement effects. In some embodiments where a film including carbon is being formed, this can also modulate sp3 bond hybridization.

As seen in FIG. 2, surface implantation or surface sub-plantation (SSP) can be complicated by several mechanisms, including sputter etching, penetration of the surface energy barrier and ion reflection. A process energy window can be estimated from calculation estimates of these effects.

In terms of the effectiveness of sp3 center generation, further consideration must be made of the mechanisms of defect creation and inelastic energy loss which can reduce sp3 center concentration by providing mechanisms to relieve localized strain by defect migration and thermal annealing (through the implant induced phonon flux) respectively. The relative rates of creation and annihilation of sp3 centers in sub-implantation and surface sub-plantation processes (and the net rate of creation of sp3 centers) is therefore dependent on careful control of the energy deposited and how it is coupled into the surface and near surface region. The competing needs to both overcome the energy barrier to surface penetration and limit the stopping distance to less than a few bond lengths constrains the available energy window to low incident particle energies. Unfortunately, the energetics are typically such that in a displacement collision, energies close to typical atomic displacement energies ($E_d$), $E_d$~20 to 25 eV, can be kinematically exchanged. At $\Delta E$ exchange close to $E_d$, a high probability for instantaneous recombination of the displaced particle and its vacancy exists, nullifying the localized distortion which is believed to be required for sp3 center formation. The use of molecular ions was proposed in the above referenced U.S. patent application Ser. No. 13/440,071 as a method to effectively extend the SSP process window by partitioning the incident ion energy on ion fragments. Where hydrocarbon molecular ions were used, e.g. acetylene, although kinematics may preclude hydrogen overcoming the surface potential barrier, chemical effects may nevertheless incorporated hydrogen in the layer, in overcoat applications, this could be undesirable at elevated concentrations.

Disclosed methods utilize the phenomenon discussed above to provide different and/or advantageous results for surface implantation (SI), surface sub-plantation (SSP), etching, doping and interfacial engineering for example.

Disclosed methods can generally include numerous steps, some of which can include the steps of providing a substrate, and directing a particle beam that includes moderately charged ions (referred to herein as "MCIs") towards the substrate to form a layer. Providing a substrate can be accomplished by placing, configuring, or otherwise locating a substrate within a system, for example.

The substrate upon which the layer is to be formed can be any type of material or structure. In some embodiments, an exemplary substrate can have at least one surface upon which the layer formation will take place. Such a surface can be referred to as "being adapted for layer formation", which can include simply being placed in a process chamber so that a layer will be formed on at least the desired surface. In some embodiments, the substrate can include structures or devices formed thereon or therein. In certain embodiments, methods disclosed herein can be utilized to form overcoats on various structures; and in such embodiments, the device upon which the overcoat is to be formed can be considered the substrate. Various processes and procedures can optionally be carried out on the substrate before a layer is formed thereon.

In some embodiments, the electrical conductivity of the substrate or surface of the substrate can be considered. It should be noted that methods disclosed herein can be utilized to form layers on virtually any surface, whether it be electrically conductive, electrically insulating, or some combination thereof. In some instances, charged particles may cause dissipation of ion potential energy, which can produce nanoscale surface disruption on metallic surfaces. This phenomenon may not be observed on nonconductive surfaces. In some embodiments, therefore, disclosed methods may utilize electrically nonconductive surfaces. In some embodiments, the electrically nonconductive surfaces include only insulating materials on the area where the layer is to be formed. In some embodiments, the electrically nonconductive surfaces can be made electrically nonconductive. For example, an otherwise electrically conductive surface can be made electrically nonconductive via a surface processing technique or can be coated with an electrically nonconductive material. A specific example of a surface processing technique includes deposition of a precursor carbon layer that is rich in sp2 carbon prior to use of disclosed methods to apply a higher sp3 content layer.

The use of a non-conductive surface may also be beneficial to reduce or prevent surface neutralization effects that could be caused by an incident ion being neutralized above a material surface before effective process level interaction with the surface or sub-surface layers can occur. Another potential benefit of utilizing MCIs for the very specific, non-limiting example of forming sp3 rich carbon overcoats includes neutralization of the incident MCI once it is has penetrated surface lying atoms or near surface atomic sublayers. This may result in a subsequent expansion of the wavefunction (i.e., an increase in the effective size of the ion) causing an increase in the localized strain and concomitant creation of sp3 centers through hybridization as described previously. In some embodiments, in order to prevent surface neutralization effects, MCIs may be incident at energies high enough to penetrate a suitably thin insulating or electronegative material coating such that charge is preserved before incidence at the desired surface or interface. Similarly, a higher than required incident particle charge may be utilized (with respect to potential energy exchange considerations) to compensate for charge neutralization that may occur with penetration into a substrate.

Even though there may be instances in which it may be desirable to have a specific type of surface, with respect to the electrical conductivity thereof, it should again be noted that any type of substrate and/or surface can be utilized herein.

Disclosed methods can also include a step of directing a particle beam towards the substrate. The particle beam can include moderately charged ions (referred to herein as "MCIs"). Disclosed MCIs can be described by various properties thereof. For example, MCIs can be described by their charge (Q), their kinetic energies, their potential energies, their type, the mass of their component atoms, or combinations thereof. In some embodiments, for a given particle mass, the charge (Q) and the kinetic energy of the MCIs can be the most relevant properties to consider.

Disclosed methods utilize particle beams that include MCIs, which can be described by their charge state (which can also be referred to herein as "Q"). MCIs can have charge states of either positive or negative. As such, the charge state can either be referred to by only the absolute value of the charge or the actual charge (specifying either positive or negative). Often, all of the MCIs in a particle beam will have the same charge. This can be accomplished using various techniques, including for example, mass and/or charge filtering, which will be discussed below. However, all of the MCIs in a particular particle beam need not have the same charge. In some embodiments, MCIs can have charges from ±2 to ±10. In some embodiments, MCIs can have charges from ±2 to ±6. In some embodiments, MCIs can have charges from ±3 to ±6. In some embodiments, the MCIs can have a charge of 3. In some embodiments, a particle beam may be made of MCIs that are positive or negatively charged with charge states between 2 and 6.

Disclosed methods utilize particle beams that include MCIs, which can also be described by their kinetic energies. The kinetic energy of a particle can also be said to describe whether the particle is fast or slow. MCIs utilized herein can be considered "slow", or as having "low kinetic energies". Often all of the MCIs in a particle beam will have substantially the same kinetic energy or a low thermal (energy) spread. This can be accomplished using various techniques, including for example, accel-decel techniques which will be discussed below. However, all of the MCIs in a particular particle beam need not have the same kinetic energy. In some embodiments, MCIs can have kinetic energies of not greater than about 2000 electron volts (eV). In some embodiments, MCIs can have kinetic energies from about 5 eV to about 2000 eV. In some embodiments, MCIs can have kinetic energies of not greater than about 200 eV. In some embodiments, MCIs can have kinetic energies from about 5 eV to about 200 eV. In some embodiments, MCIs can have kinetic energies from about 5 eV to about 100 eV.

MCIs can also be described by their potential energy. MCIs can offer an advantage in that their potential energy can exceed their kinetic energy. Table 1 below shows the potential energy of a carbon containing ion as a function of charge.

TABLE 1

| Charge of Carbon Containing Ion (Q) | Potential Energy (eV) |
| --- | --- |
| 1 | 11 |
| 2 | 35 |
| 3 | 81 |
| 4 | 145 |
| 5 | 536 |
| 6 | 1026 |

Disclosed MCIs can also be described by the atomic mass of their component atoms. In some embodiments, MCIs can be made up of atoms that have an atomic mass from about 1 to about 250 unified atomic mass units (u). In some embodiments, MCIs can be made up of atoms that have an atomic mass from about 1 to about 100 u. It should be noted that monoatomic MCIs will have a mass that is equal to the atomic mass of the constituent atom, while molecular and cluster MCIs will have a mass that is a composite of the atomic mass units of the constituent atoms.

Disclosed methods utilize particle beams that include MCIs, which can also be described by their type. MCIs can be monoatomic ions, molecular or polyatomic ions, or clusters of ions (or nanoclusters) for example. Often all of the MCIs in a particle beam will be of the same type. This can be accomplished using various techniques, including for example, mass selected accel-decel techniques which will be discussed below. However, not all of the MCIs in a particular particle beam need to be of the same type.

Figure 3:
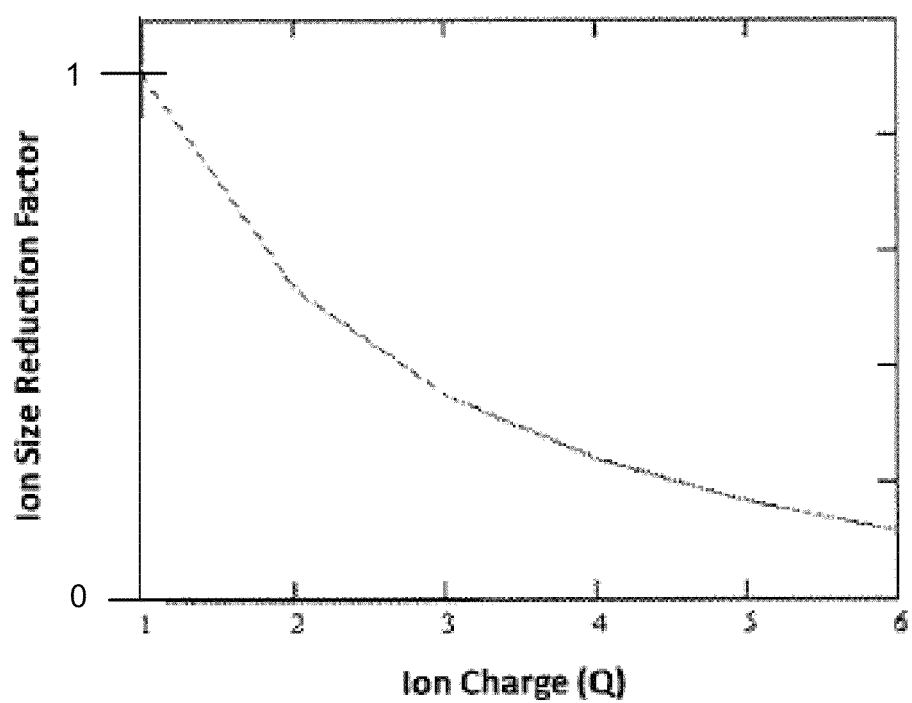
FIG. 3 shows the ion size reduction factor of a carbon containing ion as a function of charge.

Disclosed MCIs can also be described by their "effective size". The "effective size" as used herein refers to the spatial extent (size and shape) of the electronic wave function, with the degree of ionization, Q. The multiple charge state (i.e., charges having an absolute value greater than 1) of the MCIs can offer an advantage in that the "effective size" of the particle can be tailored. FIG. 3 shows a normalized ion size reduction factor (a measure of the "effective size") of a carbon containing ion as a function of the charge (Q) of the ion. As seen there, the "effective size" of the carbon containing ion decreases as the charge increases.

Figure 4:
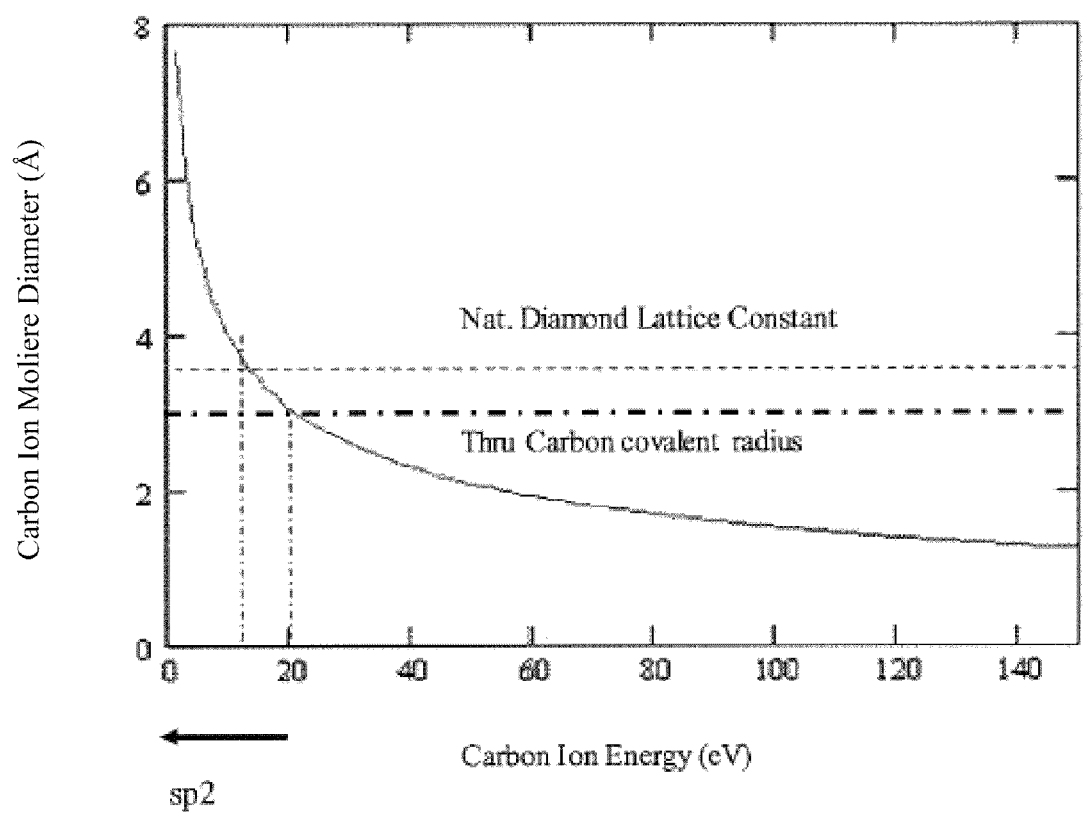
FIG. 4 shows the Moliere diameter of a singly charged carbon ion as a function of kinetic energy.

Many physical properties of atoms or ions derive from their "effective size". On the atomic or molecular scale, this can include the effective distance which describes the extent of interaction of interatomic forces between target atoms and incident particles in thin film processing. The nature of the kinematic interaction of a given incident ion with a given surface is dependent on the particle's kinetic energy through its velocity dependent collisions cross section. An example of this is shown in FIG. 4. FIG. 4 shows the Molière diameter (Å), of a singly charged carbon ion as a function of kinetic energy (eV) when colliding with static carbon target atoms. At low energies, it can be seen from the related collision cross-section that a transition will occur from a binary collision mode to complex many body type collisions governed by, e.g. a corrugated surface interaction potential with surface atoms as the cross-section extends (larger at lower energies) to overlap multiple atoms for slow ions approaching the surface. This can complicate and even limit the ability to engineer the surface.

In the specific, but non-limiting example of the regime of low energy SSP collision kinematics, a process of surface penetration or surface penetration with nanoscale sub-plantation insertion and/or displacement (e.g. in sp3 forming type processes) will eventually become surface deposition like (more sp2 type forming process) as the incident kinetic energy decreases. These considerations in addition to the kinematic effects related to surface penetration barrier energy, defect creation and phonon annealing effects previously discussed above may limit both the effectiveness and/or efficiency of the SI and SSP technique and the width of process variable window available to engineer "film" properties described in commonly owned, U.S. patent application Ser. No. 13/440,071.

Disclosed methods have the advantage of using the differentiated kinematical and potential energy characteristics of MCIs to improve the capability of surface nanoengineering techniques. As an example, a method that utilizes a carbon containing MCI having a charge state of 3 (Q=3) will effectively have half the energy dependent Moliere cross-section (shown above in FIG. 4) as monovalent ions of carbon would. This can enable the use of significantly lower incident particle energies relative to conventional monovalent ions and offer advantages in controlling the degree and depth of energy kinematically exchanged into the surface region with, e.g., subsequent desirable reduction in defect generation. Processing may proceed at incident energies close to the surface energy barrier but below the energy threshold for defect production enabling a potentially defect free surface engineering technology.

Furthermore, in disclosed methods that utilize slow MCI processes, energy exchange can be more governed by the potential energy exchange rather than kinetic energy exchange wherein the potential energy of the ions is exchanged through electronic excitation rather than purely kinematical effects in conventional thin film processing. In application to SSP techniques, the MCI potential energy may exceed that of the incident particle kinetic energy. The ability of incident particles in slow MCI processing to lose significant energy through potential energy loss rather than a largely kinetic exchange could enable entirely new capabilities in thin film nanoengineering. It should also be noted that in slow MCI processing, the effective ionic charge of the MCI may vary with the depth of penetration (path length) into a surface of the incoming particle and hence the nature of how the MCI interacts and exchanges energy into the surface layer will change with path length (depth) into the substrate surface depending on the degree of neutralization with depth for a given projectile-target atom system.

Known sources of ions can be utilized as a particle beam in disclosed methods. Generally, a source that can produce multiply charged ions can be utilized. Exemplary ion sources that could be utilized can include, for example, electron cyclotron resonance (ECR) ion sources, multicusp ion sources, and electron beam ion trap (EBIT) ion sources.

Methods disclosed herein can include steps of directing the particle beam at the substrate or surface. Directing the particle beam can be accomplished using various techniques, including for example "accel-decel" beam transport techniques. Acceleration and/or deceleration of ions, which can be referred to herein as "ion accel-decel" can be accomplished with mass selection, beam conditioning and shaping in conjunction with goniokinematic processing (coordinated real time variation of particle beam parameters with the goniometric (angle) disposition of the target process surface (with respect to the beam axis)) to control factors that afford control of process phenomena, for example etch, interfacial nanoengineering, nanodoping, surface nanoengineering of nanomaterials and metastable surface materials. Ion accel-decel approaches can circumvent particle beam transport effects, e.g. space-charge expansion, and poor ion source performance characteristics at low energies (e.g. unusably low beam currents) to improve process control. MCIs can be accelerated and conditioned at high energies and then decelerated to impact energy just prior to collision with a substrate. The existence limits for low energy processes can, however, be extremely narrow and easily corrupted.

In another embodiment, the beam may be optionally shaped. Shaping of the beam could occur e.g. at the ion source or e.g. after mass selection. In some embodiments, a narrow rectangular or line shaped beam can be an advantageous shape. Another advantageous aspect is that the particle beam itself is static and the substrate can be scanned mechanically with respect to the beam. Shaping, static incidence and independent substrate scanning may be important aspects in kinogoniometric neutral particle processing.

Massive beam divergence can be exhibited by the beam (with probable loss of process control) if proper consideration of the "throw" distance to the substrate table is not made in instrument design together with proper control of deposition rate in the process window. Process control of particle energy, beam current, beam divergence, charge state and ion mass are typically static in conventional process techniques. However variation of selected beam parameters may be used to e.g. tailor interfaces, compositional or damage center concentration profiles with and without sample goniometric motions. In conjunction, variably doped multilayer nanostructures or selective depth or surface doping may be achieved by appropriate switching of the mass filter parameters during or post-film growth e.g. in lube engineering applications.

Disclosed methods can be utilized to form layers of any material; or stated another way MCIs that are inserted into a surface layer can have any identity. In some embodiments, disclosed methods can be utilized to form layers that include carbon. In some embodiments, disclosed methods can be utilized to form layers that include carbon as a hydrocarbon (e.g., hydrogenated carbon). It should be understood however that carbon and hydrocarbons are simply an example and disclosed methods are not limited to formation of carbon and/or hydrocarbon layers or films.

The material making up the MCIs will become a component of the material of the layer being formed. In some embodiments, materials from the particle beam will be inserted into a substrate, in which case a mixture of the material from the particle beam and the substrate material will be formed. In some embodiments, layers containing the material of the MCI (carbon, for example) are formed. In some other embodiments, layers containing hydrogenated carbon (both carbon and hydrogen) are formed.

Layers that are formed can have various thicknesses. The thickness of a layer, as that phrase is utilized herein, refers to a measure of the thickness. For example, a measure of a thickness may provide an average thickness, or may provide a property that can be related to the thickness or the average thickness of the layer. For example, layers can be from about sub-monolayer (less than a monolayer of the material) to about 30 Å thick. In some embodiments layers can be from about 15 Å to about 25 Å thick; and in some embodiments, layers can be from about 15 Å to about 20 Å thick.

A layer can refer to material on the surface of a substrate, material at the interface of the substrate (i.e. materials partially implanted into the surface but also exposed as if on the surface), material within the substrate (i.e. materials implanted into the substrate and not exposed at the surface of the substrate), or any combination thereof. In some embodiments, the MCIs do not penetrate, and/or interact with atoms or molecules that are more than about 50 Å into the surface of the substrate. In some embodiments, the MCIs do not penetrate, and/or interact with atoms or molecules that are more than about 30 Å into the surface of the substrate. In some embodiments, the MCIs do not penetrate, and/or interact with atoms or molecules that are more than about 15 Å to 25 Å into the surface of the substrate. In some embodiments, the MCIs do not penetrate, and/or interact with atoms or molecules that are more than about 15 Å to 20 Å into the surface of the substrate. In embodiments, methods disclosed herein do not form layers based on nucleation growth mechanisms. Nucleation growth mechanisms fundamentally limit the minimum thickness of a continuous film.

Control of the incident particle flux distribution, its energy distribution and arrival angle distribution are key components in developing processes capable of surface nanoengineering. However, many physical properties of atoms derive from the "size" of the atom, i.e., the size and shape of its wavefunction. This includes the effective distance describing the extent of interaction of interatomic forces between atoms/particles which is of fundamental importance in controlling thin film processes. The use of slow, moderately charged ions (MCIs) enables access to new degrees of freedom in thin film processing because of the dependence of the particle's wavefunction on the charge state of the particle and the interplay between the ions potential energy and its translated energy in energy exchange.

Some disclosed methods can utilize nanoclusters or molecular ions. In such cases, the particles can be further described by their implant energy (as opposed to their incident energies). The following construct can be utilized herein in order to explain the energy of the particles. In the exemplary case of a grounded beam particle source, the incident energy ($V_{inc}$) of a particle immediately prior to its interaction with an unbiased, uncharged substrate surface is given by the sum of the beam voltage (or screen bias), $V_b$, and the plasma potential, $V_p$, assuming the incident particle is a monoatomic, singly charged ion. In this instance, the implant energy ($V_{imp}$) is the same as the incident energy ($V_{inc}$) as described. For the case of a singly charged molecular ion or cluster, it is assumed that upon interaction with atoms at the substrate surface, molecular orbital overlap results in complete fragmentation of the molecule (or cluster) into its component atomic species. The incident kinetic energy ($V_b+V_p$) minus the molecular or cluster dissociation energy is then partitioned over each atomic "fragment" according to its mass fraction ($mass_{atomic\ component}/mass_{total\ molecule\ or\ cluster}$) of the original incident molecular or cluster mass to give $V_{imp}$ of each fragment.

The implant energy of a particle (such as a nanocluster or molecular ion) can be selected (the maximum is selected) to restrict the ion projected range into the surface to less than a maximum of a few bond lengths. The implant energy of a particle can also be selected (the minimum is selected) to be at least sufficient to allow penetration of the surface energy barrier to allow incorporation of the particles into the surface. Because of the minimum energy selected (enough to allow penetration of the particle into the substrate), growth of the layer is not accomplished via typical nucleation growth mechanisms. The chosen range of implant particle energies being such that kinematic energy transfer to target atoms is either insufficient to produce displacement or, on average, to generally produce only one or two displacement reactions or sufficient to allow insertion into the surface or to distances within a few bond lengths from the surface.

The particles, once contacted with the surface of the substrate may fragment into smaller particles. In such instances, the particles themselves, the fragments of such incident particles or some combination thereof may have energies, i.e., implant energies of not greater than 100 eV. When implant energies are discussed herein, it should be understood that such energies can refer to incident particles, fragments of such incident particles produced by their interaction with the surface or any combination thereof. In some embodiments, disclosed methods include utilizing particles having implant energies of tens (10 s) of electron volts (eV). In some embodiments, methods include utilizing particles having implant energies of less than about 100 eV. In some embodiments, methods include utilizing particles having implant energies of not greater than about 80 eV. In some embodiments, methods include utilizing particles having implant energies of not greater than about 60 eV. In some embodiments, methods include utilizing particles having implant energies of not greater than about 40 eV. In some embodiments, methods include utilizing particles having implant energies of not greater than about 20 eV. In some embodiments, methods include utilizing particles having implant energies from about 20 eV to about 100 eV. In some embodiments, methods include utilizing particles having implant energies from about 20 eV to about 80 eV. In some embodiments, methods include utilizing particles having implant energies from about 20 eV to about 60 eV. In some embodiments, methods include utilizing particles having implant energies from about 20 eV to about 40 eV.

Thus, embodiments of METHODS OF FORMING LAYERS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of forming a layer, the method comprising:
providing a substrate having at least one surface adapted for deposition thereon; and
directing a particle beam towards the surface of the substrate, the particle beam comprising moderately charged ions (MCIs), substantially all the MCIs independently have positive or negative charges from 2 to 6 and kinetic energies of not greater than about 200 eV,
wherein the MCIs do not penetrate more than about 30 Å into the surface of the substrate to form a layer on the substrate.

2. The method of claim 1, wherein the MCIs are monoatomic species, molecular polyatomic species, cluster species, or combinations thereof.

3. The method of claim 1, wherein substantially all the MCIs have kinetic energies between about 5 eV and 200 eV.

4. The method of claim 1, wherein substantially all the MCIs have kinetic energies between about 5 eV and 100 eV.

5. The method of claim 1, wherein substantially all the MCIs have charges from 3 to 6.

6. The method of claim 1, wherein substantially all the MCIs have charges of positive or negative 3.

7. The method of claim 1, wherein the source of the particle beam is configured to produce multiply charged ions.

8. The method of claim 7, wherein the source is selected from an electron cyclotron resonance (ECR) ion source, a multicusp ion source, or an electron beam ion trap (EBIT) ion source.

9. A method of forming a layer, the method comprising:
providing a substrate having at least one surface adapted for deposition thereon; and
directing a particle beam towards the surface of the substrate, the particle beam comprising moderately charged ions (MCIs), substantially all the MCIs independently have positive or negative charges from 2 to 10 and kinetic energies of not greater than about 2000 eV,
wherein the MCIs do not penetrate more than about 50 Å into the surface of the substrate to form a layer on the substrate.

10. The method of claim 9, wherein substantially all the MCIs have kinetic energies between about 5 eV and 2000 eV.

11. The method of claim 9, wherein substantially all the MCIs have charges from 3 to 6.

12. The method of claim 9, wherein the source of the particle beam is configured to produce multiply charged ions.

13. The method of claim 12, wherein the source is selected from an electron cyclotron resonance (ECR) ion source, a multicusp ion source, or an electron beam ion trap (EBIT) ion source.

14. A method of forming a layer, the method comprising:
providing a substrate having at least one surface adapted for deposition thereon; and
directing a particle beam towards the surface of the substrate, the particle beam comprising moderately charged ions (MCIs) wherein substantially all the MCIs independently have positive and negative charges from 2 to 10 and kinetic energies between about 5 eV and 2000 eV, and wherein the particle beam is directed at the surface using at least an accel-decel beam transport technique,
wherein the MCIs do not penetrate more than about 50 Å into the surface of the substrate to form a layer on the substrate.

15. The method of claim 14, wherein substantially all the MCIs have a charge from 3 to 6.

16. The method of claim 14, wherein substantially all the MCIs have kinetic energies between about 5 eV and 200 eV.

17. The method of claim 14, wherein the source of the particle beam is configured to produce multiply charged ions.

18. The method of claim 17, wherein the source is selected from an electron cyclotron resonance (ECR) ion source, a multicusp ion source, or an electron beam ion trap (EBIT) ion source.

19. The method of claim 14, wherein the MCIs comprise carbon.

20. The method of claim 19, wherein the MCIs have a charge from 3 to 6.

* * * * *